US011626408B2

(12) United States Patent
Guo

(10) Patent No.: US 11,626,408 B2
(45) Date of Patent: Apr. 11, 2023

(54) MEMORY DEVICE AND FORMING METHOD THEREOF

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/806,793

(22) Filed: Jun. 14, 2022

(65) Prior Publication Data

US 2023/0055933 A1 Feb. 23, 2023

Related U.S. Application Data

(63) Continuation of application No. PCT/CN2022/071630, filed on Jan. 12, 2022.

(30) Foreign Application Priority Data

Aug. 23, 2021 (CN) .......................... 202110966709.7

(51) Int. Cl.
*H01L 27/108* (2006.01)
*H01L 29/786* (2006.01)
(Continued)

(52) U.S. Cl.
CPC .................. *H01L 27/10814* (2013.01); *H01L 21/823412* (2013.01); *H01L 21/823418* (2013.01);
(Continued)

(58) Field of Classification Search
CPC ..... H01L 21/823412; H01L 21/823418; H01L 27/10814; H01L 27/10823;
(Continued)

(56) References Cited

U.S. PATENT DOCUMENTS 8,143,121 B2 3/2012 Lin
9,337,201 B2 5/2016 Heineck et al.
(Continued)

FOREIGN PATENT DOCUMENTS

| CN | 102034761 A | 4/2011 |
| CN | 209045570 U | 6/2019 |
| JP | 2013098295 A | 5/2013 |

OTHER PUBLICATIONS

International Search Report cited in PCT/CN2022/071630 dated Mar. 24, 2022, 11 pages.
(Continued)

*Primary Examiner* — Cheung Lee
(74) *Attorney, Agent, or Firm* — Cooper Legal Group, LLC

(57) ABSTRACT

A memory device and a forming method thereof are provided. The memory device includes: a semiconductor substrate, wherein multiple active regions are formed in the semiconductor substrate, and the multiple active regions are separated by multiple first trenches extending along a first direction and multiple second trenches extending along a second direction; a third trench, extending along the first direction and located in the semiconductor substrate at the bottom of the first trench; a bit line doped region, located in the semiconductor substrate on two sides of the third trench; a gate dielectric layer, located on a sidewall surface of the first trench and a sidewall surface of the second trench; a first dielectric layer that fills the third trench; a metal gate, located in the second trench and the first trench on the first dielectric layer.

20 Claims, 11 Drawing Sheets

Figure 1:
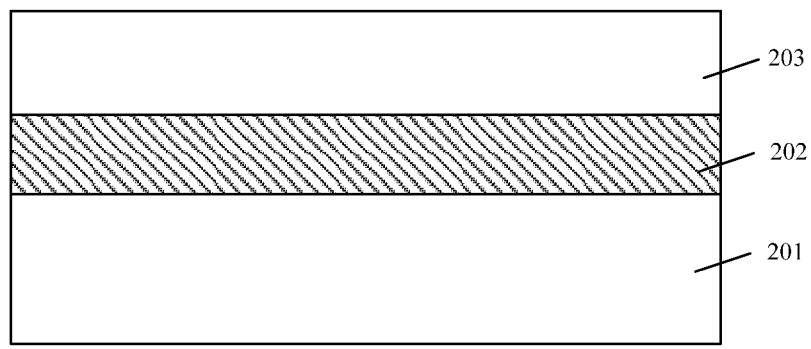

(51) Int. Cl.
*H01L 29/66* (2006.01)
*H01L 21/8234* (2006.01)
*H01L 29/423* (2006.01)

(52) U.S. Cl.
CPC .. *H01L 27/10823* (2013.01); *H01L 27/10852* (2013.01); *H01L 27/10855* (2013.01); *H01L 27/10876* (2013.01); *H01L 27/10885* (2013.01); *H01L 29/4236* (2013.01); *H01L 29/66742* (2013.01); *H01L 29/78642* (2013.01); *H01L 29/78696* (2013.01); *H01L 27/10888* (2013.01)

(58) Field of Classification Search
CPC ......... H01L 27/10841; H01L 27/10844; H01L 27/10852; H01L 27/10855; H01L 27/10876; H01L 27/10885; H01L 27/10888; H01L 28/40; H01L 28/60; H01L 29/4236; H01L 29/66666; H01L 29/66742; H01L 29/7827; H01L 29/78642; H01L 29/78696; G11C 7/18; G11C 11/404

See application file for complete search history.

(56) References Cited

U.S. PATENT DOCUMENTS

| | | |
|---|---|---|
| 2004/0201055 A1 | 10/2004 | Lutzen et al. |
| 2006/0172483 A1 | 8/2006 | Forbes |
| 2012/0094455 A1 | 4/2012 | Cho et al. |
| 2012/0112270 A1 | 5/2012 | Park et al. |
| 2013/0234240 A1 | 9/2013 | Moon et al. |

OTHER PUBLICATIONS

Written Opinion cited in PCT/CN2022/071630 dated Mar. 24, 2022, 7 pages.

MEMORY DEVICE AND FORMING METHOD THEREOF

CROSS-REFERENCE TO RELATED APPLICATIONS

This is a continuation of International Application No. PCT/CN2022/071630, filed on Jan. 12, 2022, which claims the priority to Chinese Patent Application No. 202110966709.7, titled "MEMORY DEVICE AND FORMING METHOD THEREOF" and filed with China National Intellectual Property Administration (CNIPA) on Aug. 23, 2021. The entire contents of International Application No. PCT/CN2022/071630 and Chinese Patent Application No. 202110966709.7 are incorporated herein by reference.

TECHNICAL FIELD

The present application relates to the field of memories, and in particular, to a memory device and a forming method thereof.

BACKGROUND

As a commonly used semiconductor memory in computers, a dynamic random access memory (DRAM) is composed of many repeated memory cells. Each memory cell usually includes a capacitor and a transistor. In the transistor, a gate is connected to a word line (WL), a drain is connected to a bit line (BL), and a source is connected to the capacitor. A voltage signal on the WL can control the transistor to turn on or off, and then data information stored in the capacitor is read through the BL, or data information is written into the capacitor through the BL for storage.

In order to improve integration of a memory structure, the transistor in the existing DRAM usually uses a trench-type transistor structure. However, a line width of a transistor structure of the existing trench-type has been minimized and a storage capacity of the DRAM cannot be further improved. Therefore, how to further improve the storage capacity and storage density of the DRAM is an urgent problem to be resolved by those skilled in the art.

SUMMARY

In view of this, the present application provides a novel memory device and a forming method thereof.

Therefore, some embodiments of the present application provide a method of forming a memory device, including: providing a semiconductor substrate, wherein multiple active regions are formed in the semiconductor substrate, the multiple active regions are separated by multiple first trenches extending along a first direction and multiple second trenches extending along a second direction, and the first trench communicates with the corresponding second trench; forming, in the semiconductor substrate at a bottom of the first trench, a third trench extending along the first direction, wherein a width of the third trench is less than a width of the bottom of the first trench; forming a bit line doped region in the semiconductor substrate on two sides of the third trench and at the bottom of the first trench through an ion implantation process; forming a gate dielectric layer on a sidewall is surface and a bottom surface of the first trench and a sidewall surface and a bottom surface of the second trench; forming a first dielectric layer that fills the third trench; forming a metal gate in the second trench and the first trench on the first dielectric layer, wherein a top surface of the metal gate is lower than a top surface of the active region; filling the second trench and the first trench above the metal gate with a second dielectric layer; etching a portion of the metal gate in the second trench, and segmenting the metal gate in the second trench along the second direction; forming a source region on the top surface of the active region; and forming, on a surface of the semiconductor substrate, a capacitor connected to the source region.

Some other embodiments of the present invention further provide a memory device, including:

a semiconductor substrate, wherein multiple active regions are formed in the semiconductor substrate, the multiple active regions are separated by multiple first trenches extending along a first direction and multiple second trenches extending along a second direction, and the first trench communicates with the corresponding second trench; a third trench, extending along the first direction and located in the semiconductor substrate at a bottom of the first trench, wherein a width of the third trench is less than a width of the bottom of the first trench; a bit line doped region, located in the semiconductor substrate on two sides of the third trench and at the bottom of the first trench; a gate dielectric layer, located on a sidewall surface of the first trench and the second trench; a first dielectric layer that fills the third trench; a metal gate, located in the second trench and the first trench on the first dielectric layer, wherein a top surface of the metal gate is lower than a top surface of the active region, and the metal gate in the second trench is segmented along the second direction; a second dielectric layer that fills the second trench and the first trench located above the metal gate; a source region, located on the top surface of the active region; and a capacitor, located on a surface of the semiconductor substrate and connected to the source region.

BRIEF DESCRIPTIONS OF THE DRAWINGS

FIG. 1 to FIG. 39 are each a schematic structural diagram of a formation process of a memory device according to an embodiment of the present application.

DETAILED DESCRIPTION

As described in the background, how to further improve the storage capacity and storage density of the DRAM is an urgent problem to be resolved by those skilled in the art.

Researches have found that a trench-type transistor usually includes at least one buried word line located in a semiconductor substrate and one drain region and at least one source region located in portions of the semiconductor substrate on two sides of the buried word line. Such a trench-type transistor occupies a relatively large area of the semiconductor substrate, which is not conducive to improvement of integration of the DRAM, thus limiting the storage capacity and storage density of the DRAM.

Therefore, the present application provides a novel memory device and a forming method thereof, which can further improve a storage capacity and storage density of the memory device.

To make the above objectives, features and advantages of the present application clearer, specific implementations of the present application will be described below in detail with reference to accompanying drawings. In detailed descriptions on embodiments of the present application, schematic views are not partially enlarged according to a general proportion for ease of descriptions. The schematic views merely serve as examples, rather than limitations to the scope of protection of the present application. In addition, dimensions in a three-dimensional (3D) space including a length, width and depth should be provided in actual manufacture.

Figure 13:
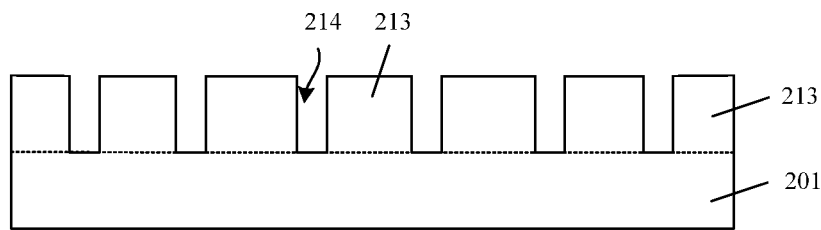
Figure 14:
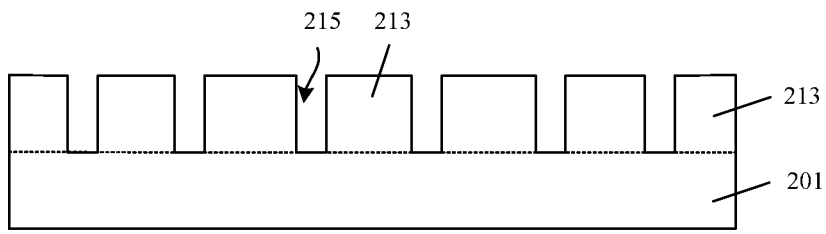
Figure 15:
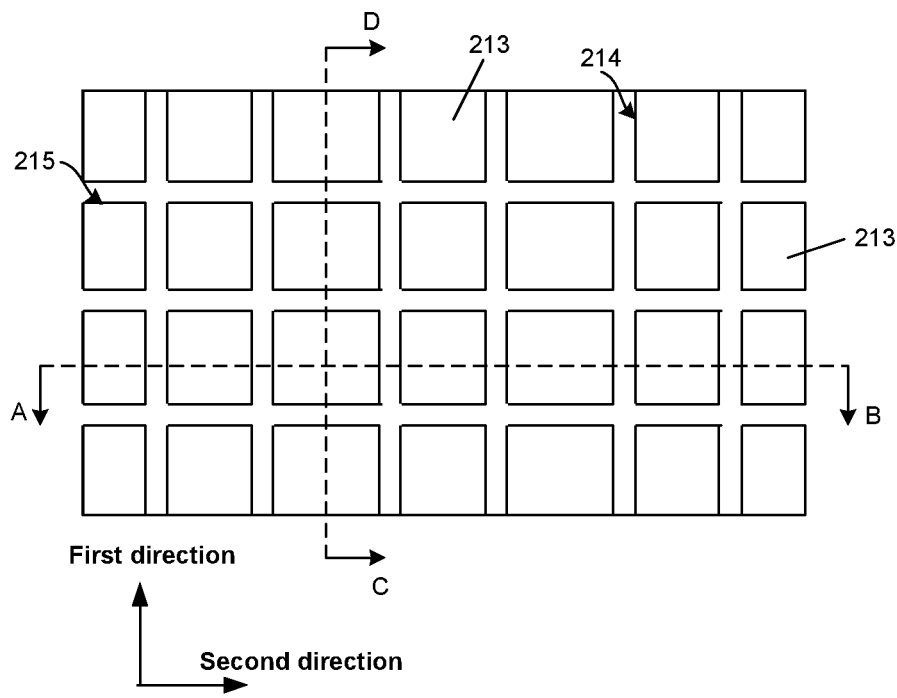

Referring to FIG. 13 to FIG. 15, FIG. 13 is a schematic structural diagram of a cross section of FIG. 15 along a direction of a cutting line AB, FIG. 14 is a schematic structural diagram of a cross section of FIG. 15 along a direction of a cutting line CD, and a semiconductor substrate 201 is provided. Multiple active regions 213 are formed in the semiconductor substrate 201, and the multiple active regions 213 are separated by multiple first trenches 214 extending along a first direction and multiple second trenches 215 extending along a second direction. The first trench 214 communicates with the corresponding second trench 215.

A material of the semiconductor substrate 201 may be silicon (Si), germanium (Ge), silicon-germanium (GeSi), or silicon carbide (SiC); or may be silicon on insulator (SOI) or germanium on insulator (GOI); or may be another material such as gallium arsenide or other III-V compounds. In this embodiment, the material of the semiconductor substrate 201 is silicon. The semiconductor substrate 201 needs to be doped with some impurity ions according to a type of a subsequently formed vertical transistor. For example, doping may be performed in a well region on the semiconductor substrate. The impurity ions may be N-type impurity ions or P-type impurity ions. The P-type impurity ions are one or more of boron ions, gallium ions, or indium ions. The N-type impurity ions are one or more of phosphorus ions, arsenic ions, or antimony ions.

The active region 213 is subsequently used to form a channel region of the vertical transistor. The multiple active regions 213 are discrete, and adjacent active regions 213 separated by cross-distributed first trenches 214 and second trenches 215.

In some embodiments, the formed active regions 213 are arranged in rows and columns (referring to FIG. 15). In other embodiments, the active regions may be arranged in another manner.

In some embodiments, the first direction and the second direction are perpendicular to each other and have an angle of 90 degrees. In other embodiments, the first direction and the second direction may not be perpendicular to each other. For example, an angle between the first direction and the second direction may be an acute angle.

In some embodiments, the semiconductor substrate 201 may be first etched to form multiple first trenches 214, and then the semiconductor substrate 201 is etched to form multiple second trenches 215, thereby forming multiple discrete active regions 213. In other embodiments, the first trench 214 and the second trench 215 may be formed simultaneously by etching the semiconductor substrate 201.

In this embodiment, the multiple active regions 213 are formed by using a self-aligned double patterning mask process. A formation process of the active region 213 is described in detail below with reference to FIG. 1 to FIG. 15.

Referring to FIG. 1, a first hard mask layer 202 is formed on the semiconductor substrate 201; and a first material layer 203 is formed on the first hard mask layer 202.

The first hard mask layer 202 is subsequently used to form a first mask pattern. In some embodiments, the first hard mask layer 202 may be of a single-layer structure or a multi-layer stacked structure. A material of the first hard mask layer 202 may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. A process of forming the first hard mask layer 202 may be atmospheric or low pressure chemical vapor deposition (CVD), plasma enhanced chemical vapor deposition (PECVD), thermal chemical vapor deposition (Thermal CVD), physical vapor deposition (PVD), atomic layer deposition (ALD), sputtering, metallization, electroplating, spin coating, other suitable methods, and/or a combination thereof. In this embodiment, the material of the first hard mask layer 202 is polycrystalline silicon.

In some embodiments, a first etching stop layer (not shown in the figure) may further be formed between the first hard mask layer 202 and the semiconductor substrate 201. The first etching stop layer is used to protect an underlying material layer from being over-etched during patterning of the first hard mask layer. A material of the first etching stop layer is different from that of the first hard mask layer. The material of the first etching stop layer is one or more of silicon nitride, silicon oxynitride, silicon oxide, silicon nitride bonded silicon carbide, and silicon oxycarbide. In this embodiment, the material of the first etching stop layer is silicon oxide.

The first material layer 203 is subsequently used to form a first strip structure. In some embodiments, the first material layer 203 may be of a single-layer structure or a multi-layer stacked structure. A material of the first material layer 203 may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. In this embodiment, the material of the first material layer 203 is amorphous carbon.

In some embodiments, a second etching stop layer (not shown in the figure) may further be formed between the first material layer 203 and the first hard mask layer 202. The second etching stop layer is used to protect an underlying material layer from being over-etched during patterning of the first material layer 203. A material of the second etching stop layer is different from that of the first material layer 203. The material of the second etching stop layer is one or more of silicon nitride, silicon oxynitride, silicon oxide, silicon nitride bonded silicon carbide, and silicon oxycarbide. In this embodiment, the material of the second etching stop layer is silicon oxynitride.

Figure 2:
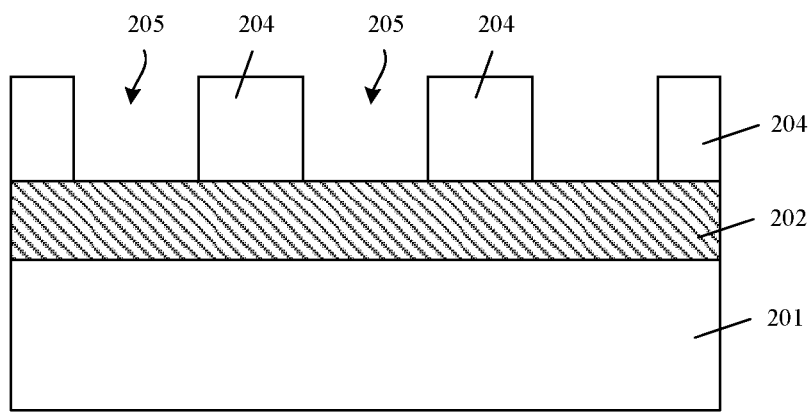
Figure 3:
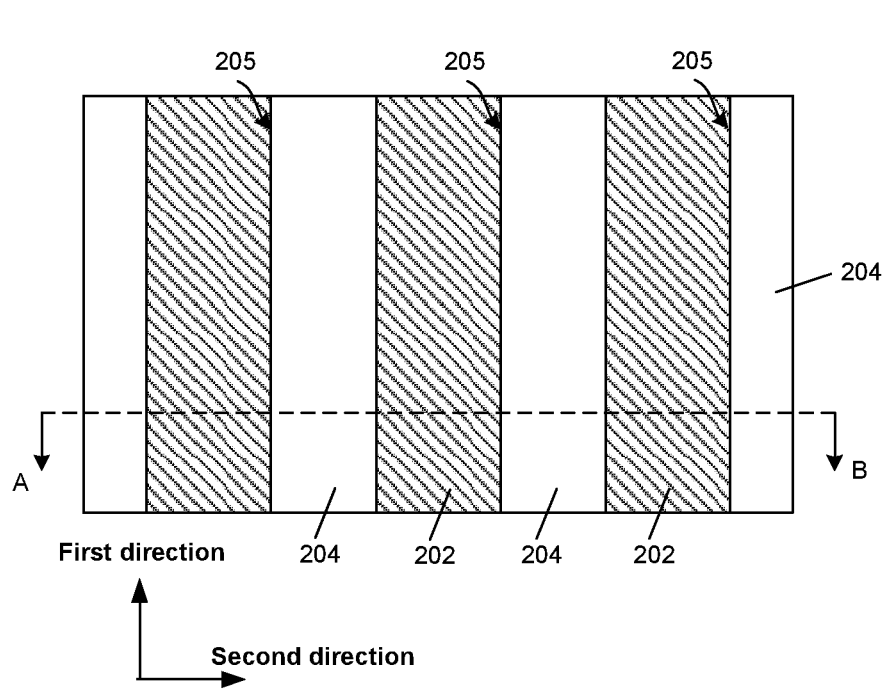

Referring to FIG. 2 and FIG. 3, FIG. 2 is a schematic structural diagram of a cross section of FIG. 3 along a direction of a cutting line AB. The first material layer 203 (referring to FIG. 1) is patterned. Multiple first strip structures 204 extending along the first direction and arranged parallel to each other are formed on the first hard mask layer.

The first strip structure 204 is elongated. The multiple first strip structures 204 are discrete and parallel to each other. A fourth opening 205 is formed between adjacent first strip structures 204.

In some embodiments, the first material layer 203 is patterned by using an anisotropic dry etching process, and specifically, an anisotropic plasma etching process may be used.

In some embodiments, before the first material layer 203 is patterned, a patterned photoresist layer (not shown in the figure) may further be formed on the first material layer 203, and the first material layer 203 is etched by using the patterned photoresist layer as a mask to form a first strip structure 204; and the patterned photoresist layer is removed.

Figure 4:
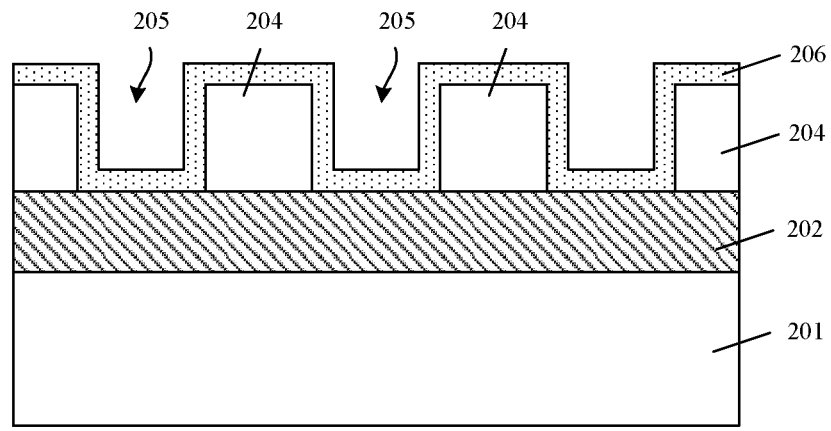

Referring to FIG. 4, FIG. 4 is performed on the basis of FIG. 2, and a first sacrificial sidewall layer 206 is formed on sidewall and top surfaces of the first strip structure 204 and on a portion of the first hard mask layer 202 between first strip structures 204.

A material of the first sacrificial sidewall layer 206 is different from that of the first strip structure. The material of the first sacrificial sidewall layer 206 may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. The first sacrificial sidewall layer 206 is formed by using a deposition process. The deposition process includes an atomic layer deposition process.

Figure 5:
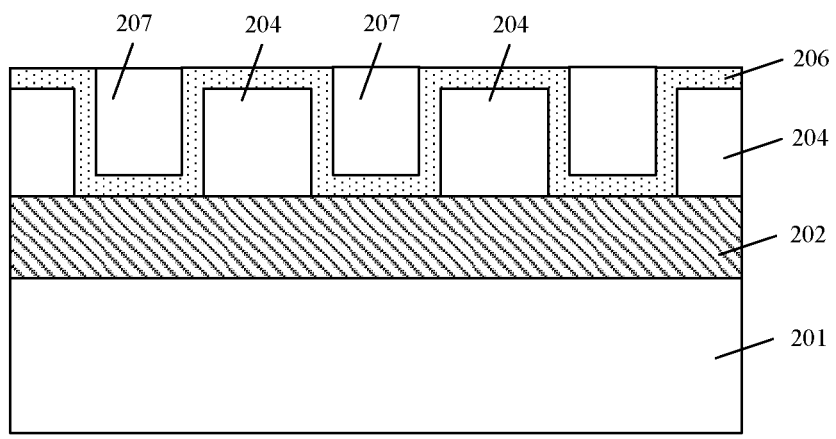

Referring to FIG. 5, each portion between the first strip structures 204 is filled with a first filling layer 207, and the first filling layer 207 fills the remaining portion of the fourth opening.

Subsequently, a third opening is formed between the first strip structure 204 and the first filling layer 207 by removing portions of the first sacrificial sidewall layer on the sidewall surfaces of the first strip structure 204.

A material of the first filling layer 207 is different from that of the first sacrificial sidewall layer 206. In some embodiments, the material of the first filling layer 207 may be one or more of polycrystalline silicon, amorphous silicon, amorphous carbon, silicon nitride, silicon oxynitride, silicon oxide, silicon nitride bonded silicon carbide, silicon oxycarbide, silicon carbide, silicon-germanium, and an organic material. A process of forming the first filling layer 207 may be atmospheric or low pressure CVD, PECVD, thermal CVD, PVD, ALD, sputtering, metallization, electroplating, spin coating, other suitable methods, and/or a combination thereof.

In some embodiments, a surface of the formed first filling layer 207 may be flush with the first sacrificial sidewall layer 206 on the top surface of the first strip structure 204. Specifically, after a first filling material layer covering the first sacrificial sidewall layer 206 and filling the remaining portion of the fourth opening is formed, a portion of the first filling layer above the first sacrificial sidewall layer 206 on the top surface of the first strip structure 204 is removed by using a chemical-mechanical mask process. The remaining portion of the first filling material layer in the fourth opening is used as the first filling layer 207.

In some embodiments, a surface of the formed first filling layer may be flush with the top surface of the first strip structure 204. Specifically, after a first filling material layer covering the first sacrificial sidewall layer 206 and filling the remaining portion of the fourth opening is formed, a portion of the first sacrificial sidewall layer 206 and the first filling material layer above the top surface of the first strip structure 204 are removed by using a chemical-mechanical mask process, to expose the top surface of the first strip structure 204, and the remaining portion of the first filling material layer in the fourth opening is used as the first filling layer. Therefore, a top surface of the formed first filling layer is flush with the top surface of the first strip structure. After the third opening is subsequently formed, during etching of the first hard mask layer, an etching load effect caused by a height difference between the filling layer and the first strip structure can be alleviated, accuracy of positions and sizes of the formed first mask patterns can be improved, and a favorable sidewall shape can be maintained, such that positions and sizes of block mask patterns formed after the first mask patterns are segmented have relatively high accuracy and a favorable sidewall shape is maintained, and finally, positions and sizes of active is regions formed by etching the semiconductor substrate by using each of the block mask patterns as a mask have relatively high accuracy and a favorable sidewall shape is maintained.

Figure 6:
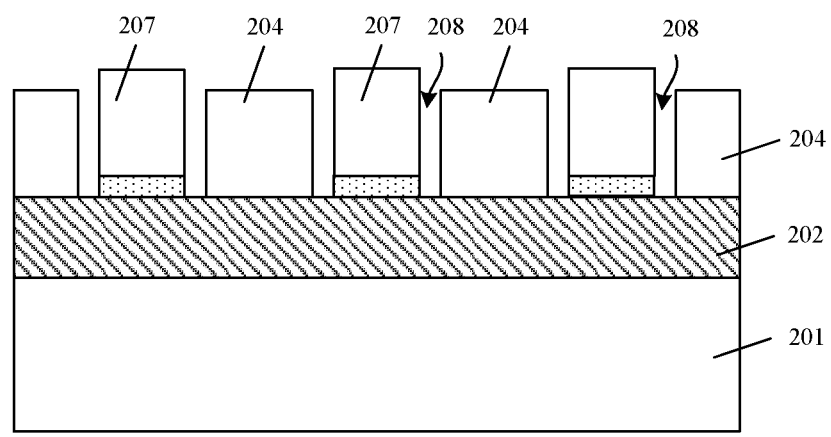

Referring to FIG. 6, portions of the first sacrificial sidewall layer on the sidewall surfaces of the first strip structure 204 are removed, to form a third opening 208 between the first strip structure 204 and the first filling layer 207.

In some embodiments, the portions of the first sacrificial sidewall layer on the sidewall surfaces of the first strip structure 204 are removed by using an isotropic dry etching process, including an anisotropic plasma etching process.

It should be noted that, in some embodiments, during the removal of the portions of the first sacrificial sidewall layer on the sidewall surfaces of the first strip structure 204, the portion of the first sacrificial sidewall layer on the top surface of the first strip structure 204 is also removed.

Figure 7:
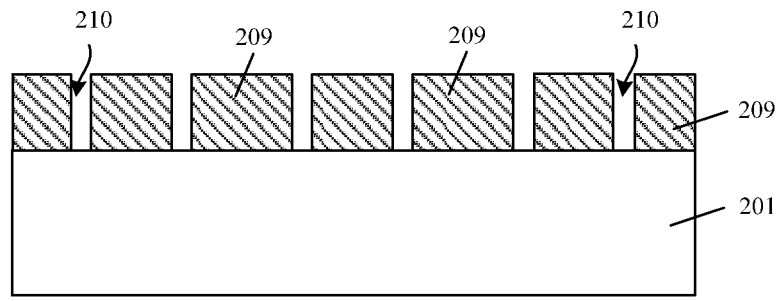
Figure 8:
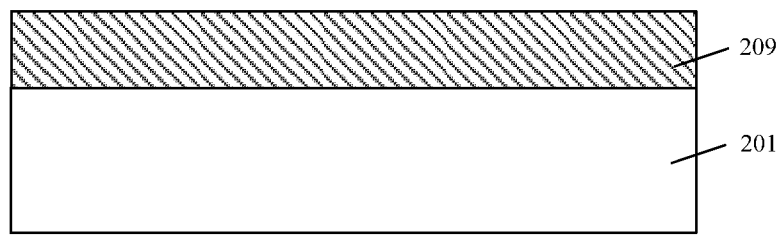
Figure 9:
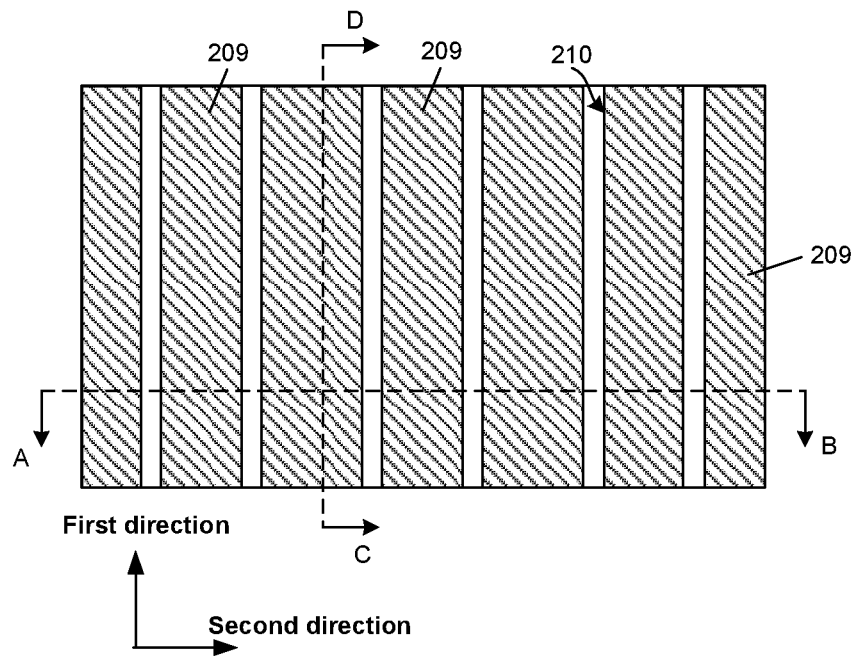

Referring to FIG. 7 to FIG. 9, FIG. 7 is performed on the basis of FIG. 6, FIG. 7 is a schematic structural diagram of a cross section of FIG. 9 along a direction of a cutting line AB, and FIG. 8 is a schematic structural diagram of a cross section of FIG. 9 along a direction of a cutting line CD. The first hard mask layer 202 (referring to FIG. 6) is etched along the third opening 208 (referring to FIG. 6), to form the first opening 210 in the first hard mask layer, and the retained portion of the first hard mask layer is used as the first mask pattern 209.

In some embodiments, the first hard mask layer 202 is etched by using an anisotropic dry etching process, including an anisotropic plasma etching process.

The formed multiple first mask patterns 209 are discrete. Specifically, the formed first mask patterns 209 extend along the first direction and are parallel to each other, and a first opening 210 is formed between adjacent first mask patterns 209.

In the present application, the foregoing first mask pattern 209 is formed by using the foregoing self-aligned double patterning process, and subsequently, during the formation of the active region, a width of the first trench between active regions can be made relatively small, thereby allowing an area of the active region to be relatively large.

Figure 10:
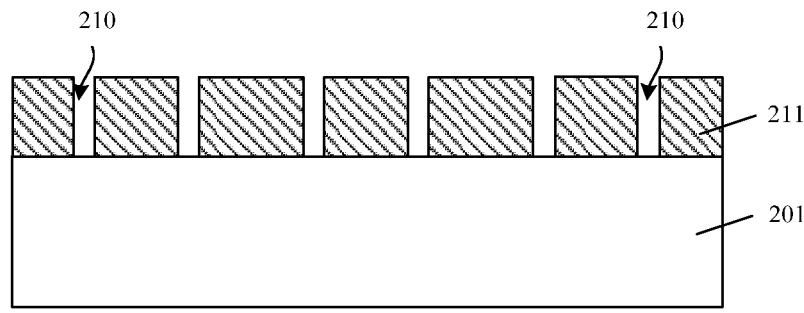
Figure 11:
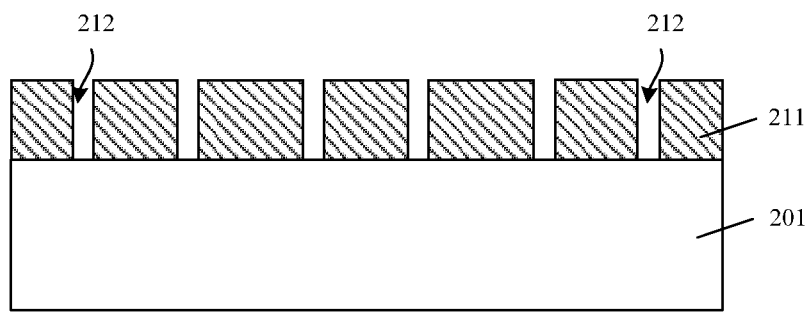
Figure 12:
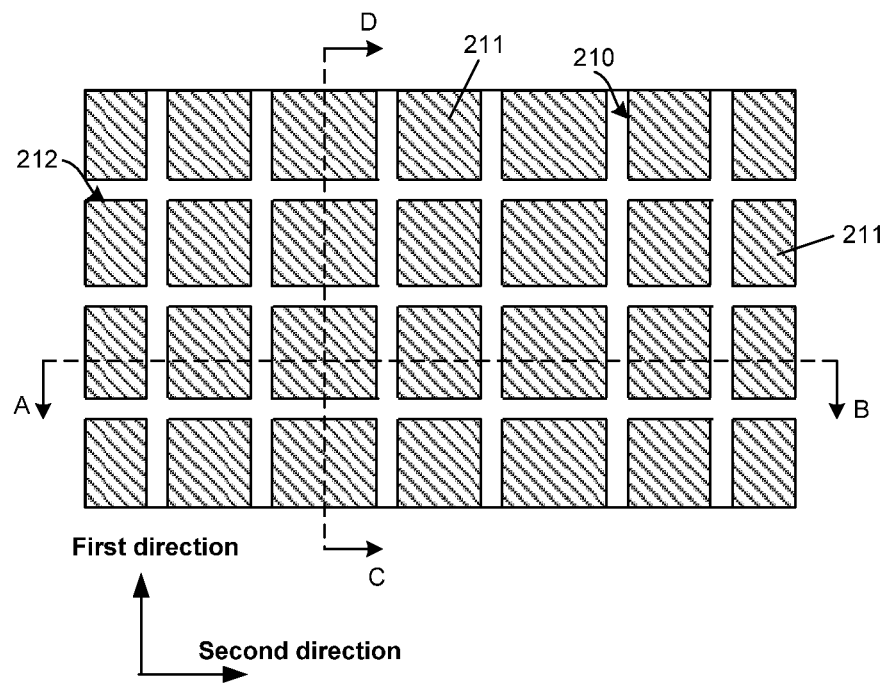

Referring to FIG. 10 to FIG. 12, FIG. 10 is a schematic structural diagram of a cross section of FIG. 12 along a direction of a cutting line AB, and FIG. 11 is a schematic structural diagram of a cross section of FIG. 12 along a direction of a cutting line CD. The first mask patterns 209 (referring to FIG. 7 to FIG. 9) are segmented along the second direction to form multiple discrete block mask patterns 211.

The first mask patterns 209 (referring to FIG. 7 to FIG. 9) are segmented along the second direction by using an anisotropic dry etching process. In some embodiments, before the first mask patterns 209 are segmented along the second direction, multiple second mask patterns extending along the second direction and parallel to each other are formed on the first mask pattern 209 and are each used as a mask for etching the first mask patterns 209, and a second opening is formed between adjacent second mask patterns; the first mask patterns 209 are etched along the second opening by using each of the second mask patterns as a mask, to segment the first mask patterns along the second direction to form multiple discrete block mask patterns 211; and the second mask patterns are removed.

In some embodiments, the second mask pattern may be formed by using a self-aligned double patterning process. A specific process includes: A formation process of the second mask pattern includes: forming a second hard mask layer on the semiconductor substrate and the first mask pattern; forming, on the second hard mask layer, multiple second strip structures arranged in parallel along the second direction; form a second sacrificial sidewall layer on a sidewall and top surfaces of the second strip structure and on a surface of a portion of the second hard mask layer between second strip structures; filling each portion between the second strip structures with a second filling layer; removing portions of the second sacrificial sidewall layer on the sidewall surfaces of the second strip structure, to form a fourth opening between the second strip structure and a second filling layer; and etching the second hard mask layer along the fourth opening, to form the second opening in the second hard mask layer, and using the retained portion of the second hard mask layer as the second mask pattern.

A material of the second hard mask layer may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. A process of forming the second hard mask layer may be atmospheric or low pressure CVD, PECVD, thermal CVD, PVD, ALD, sputtering, metallization, electroplating, spin coating, other suitable methods, and/or a combination thereof.

In some embodiments, a fourth etching stop layer may further be formed between the second hard mask layer and the first mask pattern 209. A material of the fourth etching stop layer is different from that of the second hard mask layer. The material of the fourth etching stop layer is one or more of silicon nitride, silicon oxynitride, silicon oxide, silicon nitride bonded silicon carbide, and silicon oxycarbide.

A material of the second strip structure may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. In some embodiments, the second strip structure may be formed by etching a second material layer located on the second hard mask layer. In some embodiments, a fifth etching stop layer may be further formed between the second material layer and the second hard mask layer. A material of the fifth etching stop layer is different from that of the second material layer. The material of the fifth etching stop layer is one or more of silicon nitride, silicon oxynitride, silicon oxide, silicon nitride bonded silicon carbide, and silicon oxycarbide.

A material of the second sacrificial sidewall layer is different from that of the second strip structure. The material of the second sacrificial sidewall layer may be one or more of polycrystalline silicon, amorphous silicon, amorphous carbon, silicon nitride, silicon oxynitride, silicon oxide, silicon nitride bonded silicon carbide, silicon oxycarbide, silicon carbide, and silicon-germanium. The second sacrificial sidewall layer is formed by using a deposition process. The deposition process includes an atomic layer deposition process.

A material of the second filling layer is different from that of the second sacrificial sidewall layer. In some embodiments, the material of the second filling layer may be one or more of polycrystalline silicon, amorphous silicon, amorphous carbon, silicon nitride, silicon oxynitride, silicon oxide, silicon nitride bonded silicon carbide, silicon oxycarbide, silicon carbide, silicon-germanium, and an organic material. A process of forming the second filling layer may be atmospheric or low pressure CVD, PECVD, thermal CVD, PVD, ALD, sputtering, metallization, electroplating, spin coating, other suitable methods, and/or a combination thereof.

In some embodiments, a surface of the formed second filling layer may be flush with is the second sacrificial sidewall layer on the top surface of the second strip structure. Specifically, after a second filling material layer covering the second sacrificial sidewall layer and filling a space between second strip structures is formed, a portion of the second filling layer above the surface of the second sacrificial sidewall layer on the top surface of the second strip structure is removed by using a chemical-mechanical mask process. The remaining portion of the second filling material layer between the second strip structures is used as the second filling layer.

In some embodiments, a surface of the formed second filling layer may be flush with the top surface of the second strip structure. Specifically, after a second filling material layer covering the second sacrificial sidewall layer and filling a space between second strip structures is formed, a portion of the second sacrificial sidewall layer and the second filling material layer above the top surface of the second strip structure are removed by using a chemical-mechanical mask process, to expose the top surface of the second strip structure, and the remaining portion of the second filling material layer in the space between the second strip structures is used as the second filling layer. Therefore, a top surface of the formed second filling layer is flush with the top surface of the second strip structure. After the fourth opening is subsequently formed, during etching of the second hard mask layer, an etching load effect caused by a height difference between the filling layer and the second strip structure can be alleviated, accuracy of positions and sizes of the formed second mask patterns can be improved, and a favorable sidewall shape can be maintained, such that positions and sizes of block mask patterns formed after the first mask patterns are segmented have relatively high accuracy and a favorable sidewall shape is maintained, and finally, positions and sizes of active regions formed by etching the semiconductor substrate by using each of the block mask patterns as a mask have relatively high accuracy and a favorable sidewall shape is maintained.

In some embodiments, the portions of the first sacrificial sidewall layer on the sidewall surfaces of the second strip structure are removed by using an anisotropic dry etching process, including an anisotropic plasma etching process.

Referring to FIG. 13 to FIG. 15, FIG. 13 is a schematic structural diagram of a cross section of FIG. 15 along a direction of a cutting line AB, and FIG. 14 is a schematic structural diagram of a cross section of FIG. 15 along a direction of a cutting line CD. The is semiconductor substrate 201 is etched by using each of the block mask patterns (referring to FIG. 11) as a mask, to form, in the semiconductor substrate 201, first trenches 214 corresponding to the first openings and second trenches 215 corresponding to the second openings. Multiple first trenches 214 extend along the first direction and are parallel to each other. Multiple second trenches 215 extend along the second direction and are parallel to each other. Each first trench 214 communicates with a corresponding second trench 215. The retained portions of the semiconductor substrate between the first trenches 214 and the second trenches 215 are multiple active regions 213.

Figure 16:
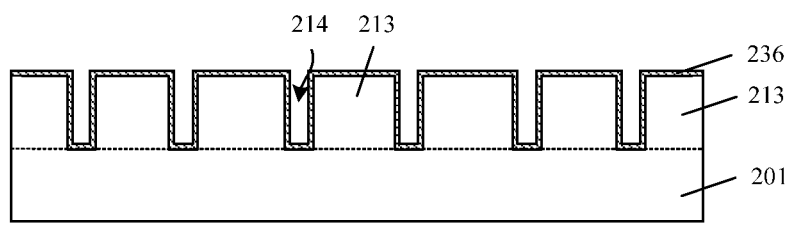
Figure 17:
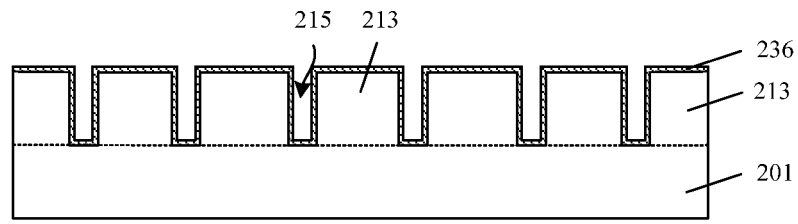

In some embodiments, referring to FIG. 16 and FIG. 17, FIG. 16 is performed on the basis of FIG. 13, FIG. 17 is performed on the basis of FIG. 14, and a protective layer 236 is formed on each of a surface of the active region 213 and sidewall and bottom surfaces of the first trench and the second trench.

The protective layer 236 protects the active region 213 during a subsequent process (etching, implantation, or other processes). A material of the protective layer 236 may be one or more of silicon oxide, silicon nitride, silicon oxynitride, and silicon nitride bonded silicon carbide. In this embodiment, the material of the protective layer 236 may be silicon oxide, and the protective layer 236 may be formed by using a furnace tube oxidation process, a thermal oxidation process, or a deposition process.

Figure 18:
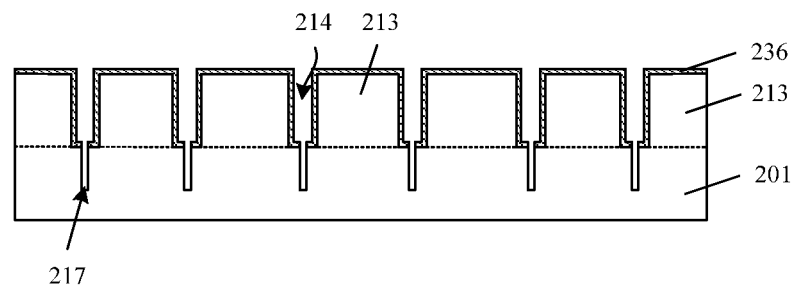
Figure 19:
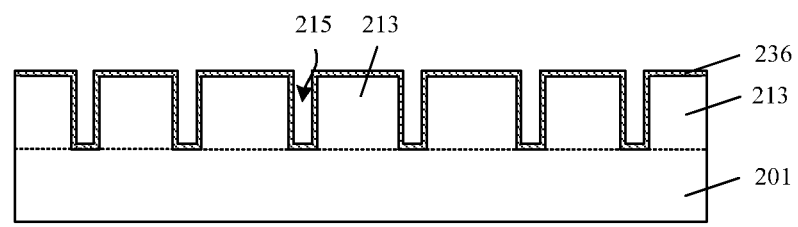

Referring to FIG. 18 and FIG. 19, a third trench 217 extending along the first direction is formed in a portion of the semiconductor substrate 201 at the bottom of the first trench 214. A width of the third trench 217 is less than a width of the bottom of the first trench 214.

The third trench 217 is formed for the purpose of separating adjacent active regions 213 that are arranged along the second direction, and defining positions of bit line doped regions (specifically, portions of the semiconductor substrate on two sides of the third trench are used as bit line doped regions of corresponding transistors).

Each portion of the semiconductor substrate 201 at the bottom of the first trench 214 has a corresponding third trench 217. A width of the third trench 217 is less than the width of the bottom of the first trench 214. In some embodiments, the width of the third trench 217 is ¼ to ¾ of the width of the bottom of the first trench 214.

In some embodiments, the portion of the semiconductor substrate 201 at the bottom is of the first trench 214 is etched to form the third trench 217 extending along the first direction. Before the semiconductor substrate 201 is etched, a third mask layer is formed in the first trench 214 and on the semiconductor substrate 201, and a sixth opening extending along the first direction and exposing a surface of a portion of the semiconductor substrate 201 at the bottom of the first trench 214 is formed in the third mask layer. The semiconductor substrate 201 is etched along the sixth opening to form the third trench 217. The etching is anisotropic dry etching, and may anisotropic plasma etching. The third mask layer is removed.

Referring to FIG. 20 to FIG. 23, bit line doped regions 218 are formed in portions of the semiconductor substrate 201 on two sides of the third trench 217 and at the bottom of the first trench 214 through an ion implantation process.

The bit line doped region 218 is subsequently used as a bit line of a memory, a portion of the bit line doped region in contact with each active region 213 may be used as a drain region of a subsequently formed vertical transistor in each active region, and after the vertical transistor is subsequently formed, the bit line may be used to perform a read or write operation on a row of memories arranged along the first direction.

The bit line doped region 218 is formed through ion implantation. A type of impurity ions implanted in the bit line doped region 218 is different from a type of impurity ions implanted in the active region 213. For example, when P-type impurity ions are implanted in the active region 213, N-type impurity ions are implanted in the bit line doped region 218, or when N-type impurity ions are implanted in the active region 213, P-type impurity ions are implanted in the bit line doped region 218. The impurity ions implanted in the bit line doped region 218 are N-type impurity ions or P-type impurity ions. The P-type impurity ions are one or more of boron ions, gallium ions, or indium ions. The N-type impurity ions are one or more of phosphorus ions, arsenic ions, or antimony ions.

Figure 20:
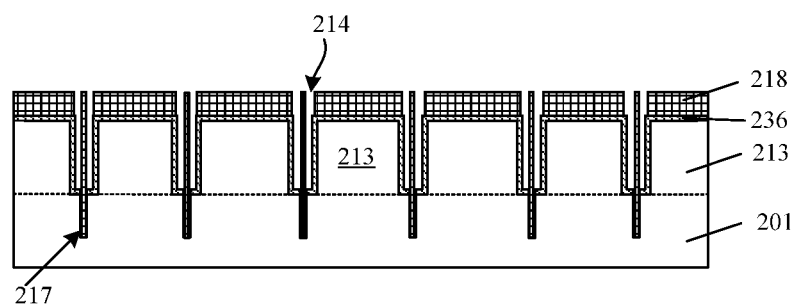
Figure 21:
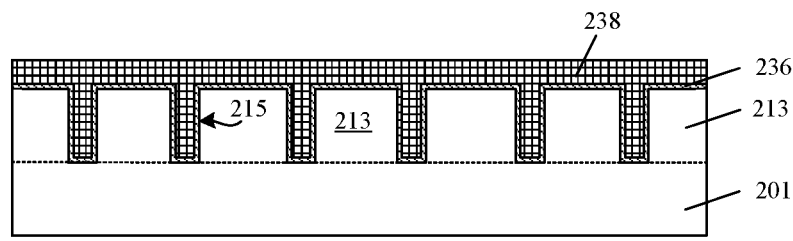
Figure 22:
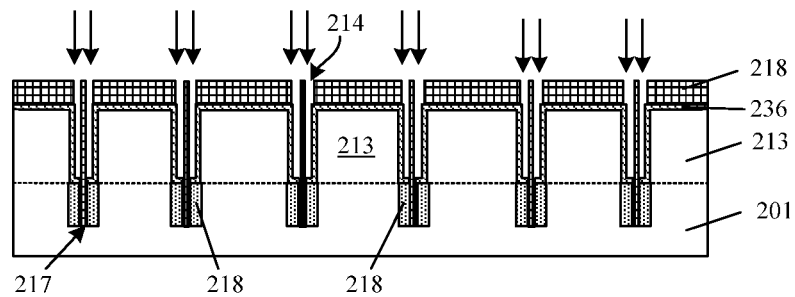
Figure 23:
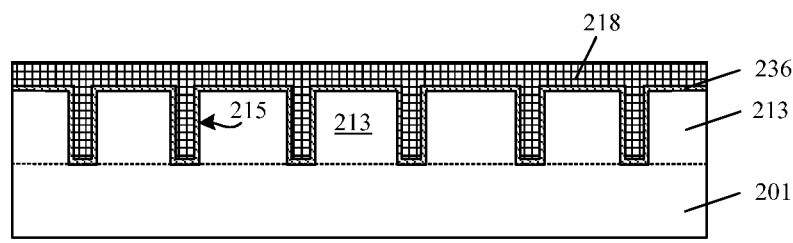

In some embodiments, before the ion implantation is performed, referring to FIG. 20 and FIG. 21, a fourth mask layer 238 is formed in the third trench 217 and on the top surface of the active region 213, and a seventh opening extending along the first direction and exposing the portions of the semiconductor substrate 201 on the two sides of the third trench 217 is formed in the fourth mask layer 238. Referring to FIG. 22 and FIG. 23, first ion implantation is formed on a portion of the semiconductor substrate 201 at the is bottom of the seventh opening along the seventh opening, and the bit line doped regions 218 are formed in the portions of the semiconductor substrate 201 on the two sides of the third trench 217 and at the bottom of the first trench 214. After the formation of the bit line doped regions 218, the fourth mask layer 238 is removed. The bit line doped regions 218 are distributed in the portions of the semiconductor substrate 201 on two sides of the active region 213, such that a control capability of the bit line can be improved and electrical properties of the memory can be improved.

In some embodiments, the first ion implantation has energy of 20 key to 100 key, a dose of 1E13 to 1E22 atom/cm$^2$, and an angle of 0 degrees to 20 degrees.

Figure 24:
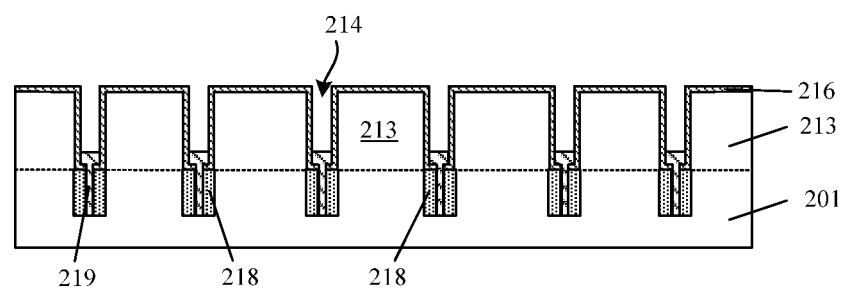
Figure 25:
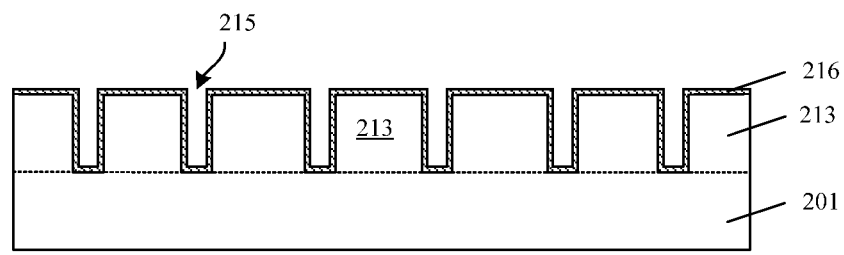

Referring to FIG. 24 and FIG. 25, a gate dielectric layer 216 is formed on sidewall surfaces and a bottom surface of each of the first trench 214 and the second trench 215.

A material of the gate dielectric layer 216 may be silicon oxide or a high-K (dielectric constant) dielectric material. The high-K dielectric material is one or more of $HfO_2$, $TiO_2$, HfZrO, HfSiNO, $Ta_2O_5$, $ZrO_2$, $ZrSiO_2$, $Al_2O_3$, $SrTiO_3$, or BaSrTiO.

The gate dielectric layer 216 may be formed by using an oxidation process or a deposition process.

In some embodiments, the gate dielectric layer 216 may be formed after the removal of the protective layer 236. In another embodiment, a gate dielectric layer may be formed directly on the protective layer 236 without removing the protective layer 236.

In some embodiments, during formation of the gate dielectric layer 216, the gate dielectric layer 216 may alternatively be formed on sidewall and bottom surfaces of the third trench or directly fill the third trench.

In some embodiments, when the third trench is not filled with a gate dielectric layer material, still referring to FIG. 24, after formation of the gate dielectric layer 216, a first dielectric layer 219 that fills the third trench is formed.

The formed first dielectric layer 219 is used for electrical isolation between adjacent bit line doped regions 218. In some embodiments, a material of the first dielectric layer 219 is silicon oxide, silicon nitride, silicon oxynitride, fluorine-doped silica glass (FSG), a low dielectric constant (where K is less than 2.8) material, other suitable materials, and/or a combination thereof.

In some embodiments, a formation process of the first dielectric layer 219 includes: forming a first dielectric material layer on a surface of the active region 213 and in the first trench 214, the second trench 215, and the third trench by using a deposition process; and etching back to remove a portion of the first dielectric material layer, to form the first dielectric layer 219 that fills the third trench.

In some embodiments, the formed first dielectric layer 219 fills the third trench, and a surface of the first dielectric layer 219 may be higher than an opening of the third trench and partially located in the first trench 214.

Figure 26:
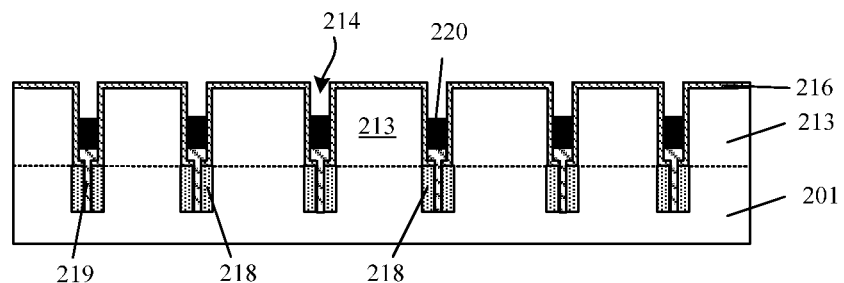
Figure 27:
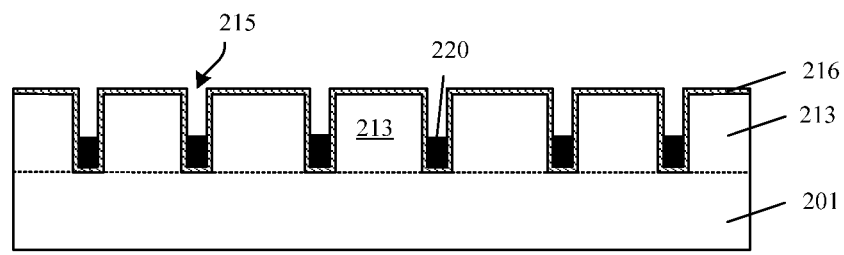

Referring to FIG. 26 and FIG. 27, a metal gate 220 is formed in each of the first trench 214 on the first dielectric layer 219 and the second trench 215. A top surface of the metal gate 220 is lower than a top surface of the active region 213.

The formed metal gate 220 is located in the second trench 215 and the first trench 214, that is, the formed metal gate 220 surrounds sidewalls of each active region, such that a capability of the metal gate 220 to control the formation of a trench in the sidewall of the active region can be improved, and performance of forming a vertical transistor can be improved.

In some embodiments, a material of the metal gate 220 may be one or more of W, Al, Cu, Ag, Au, Pt, Ni, Ti, TiN, TaN, Ta, TaC, TaSiN, WN, and Wsi.

In some embodiments, a formation process the metal gate 220 is: forming a metal layer in the first trench and the second trench and on a surface of the active region; and etching back to remove a portion of the metal layer, and using the remaining metal layer in the first trench and the second trench as the metal gate 220, where a surface of the metal gate 220 is lower than the top surface of the active region 213.

Figure 28:
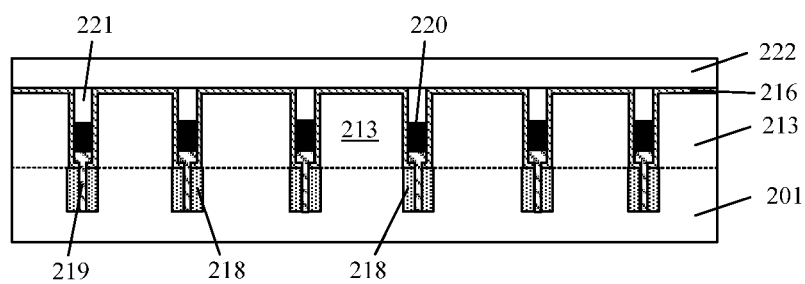
Figure 29:
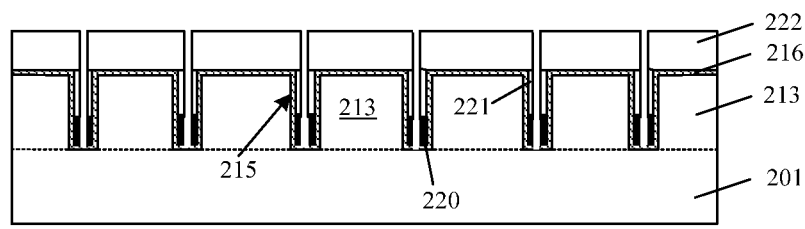

Referring to FIG. 28 and FIG. 29, a portion of each of the second trench and the first trench above the metal gate 220 is filled with a second dielectric layer 221; and a portion of the metal gate 220 in the second trench 215 is etched to segment the metal gate 220 in the second trench along the second direction.

The metal gate 220 is segmented along the second direction, such that multiple sub-metal gates extending along the second direction and parallel to each other can be formed, and each sub-metal gate can correspondingly control multiple vertical transistors formed in multiple active regions in a row along the second direction.

In some embodiments, a portion of the metal gate 220 in the second trench is segmented along the second direction, to form a fifth mask layer 222 on a surface of the second dielectric layer 221 and a top surface of the active region 213, and an eighth opening extending along the second direction and exposing a surface of a portion of the second dielectric layer 221 in the second trench is formed in the fifth mask layer 222; and portions of the second dielectric layer 221 and the metal gate 220 in the second trench are etched along the eighth opening to segment the metal gate in the second trench.

In some embodiments, a material of the second dielectric layer 221 is silicon oxide, silicon nitride, silicon oxynitride, FSG, a low dielectric constant (where K is less than 2.8) material, other suitable materials, and/or a combination thereof.

Figure 30:
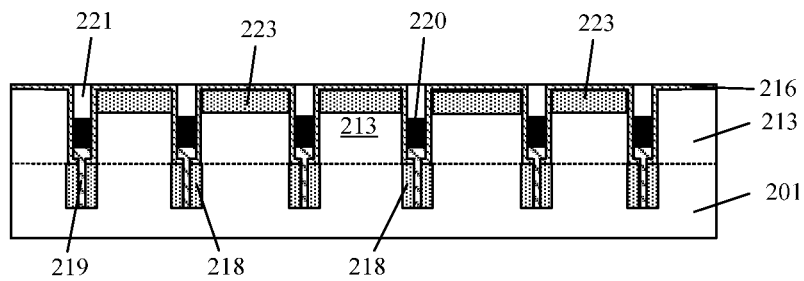
Figure 31:
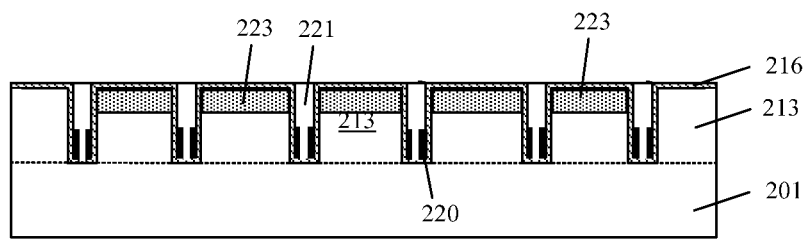

Referring to FIG. 30 and FIG. 31, the fifth mask layer 222 (referring to FIG. 28 and FIG. 29) is removed; gaps of the segmented metal gate 220 and the second trench are filled with a dielectric material, and the filled dielectric material is used as a portion of the second dielectric layer 221; and a source region 223 is formed on the top surface of the active region 213.

A type of impurity ions doped in the source region 223 is the same as a type of impurity ions doped in the bit line doped region 218, and is different from the type of the impurity ions doped in the foregoing well region. The source region 223 is formed by using a second ion implantation process. The impurity ions implanted (doped) in the bit line doped region 218 are N-type impurity ions or P-type impurity ions. The P-type impurity ions are one or more of boron ions, gallium ions, or indium ions. The N-type impurity ions are one or more of phosphorus ions, arsenic ions, or antimony ions.

In the present application, multiple vertical transistors are formed through the foregoing process, and each vertical transistor includes a corresponding active region 213, a gate dielectric layer 216 located on a sidewall surface of the active region 213, bit line doped regions 218 located in portions of a semiconductor substrate at the bottom of a first trench and on two sides of a third trench, a source region 223 located on a top surface of the active region 213, and a metal gate 220 located in each of the first trench and a second trench and surrounding the active region 213. In the foregoing vertical transistor of a specific structure, a source region and a drain region are located on an upper side and a lower side of the active region, and a formed channel region is located on a sidewall of the active region, such that an area of the semiconductor substrate is occupied by the vertical transistor is relatively small, a quantity of vertical transistors formed per unit area can be increased, and correspondingly, a quantity of capacitors connected to the source region of each transistor and subsequently formed per unit area can also be increased, thereby improving a storage capacity and storage density of a memory. In addition, use of the vertical transistor of such a specific structure can reduce a body effect, reduce a leakage current generated by a subsequently formed capacitor into the substrate, and improve electrical properties of the memory device.

In some embodiments, after formation of the source region 223, the following is further included: forming, on a surface of the semiconductor substrate 201, a capacitor connected to the source region 223.

Figure 32:
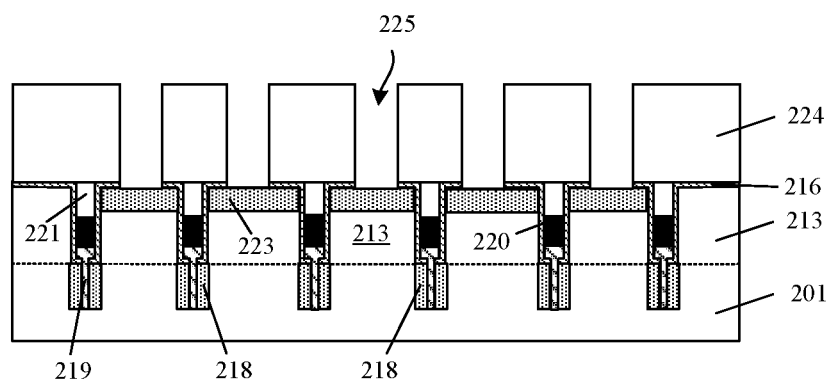
Figure 33:
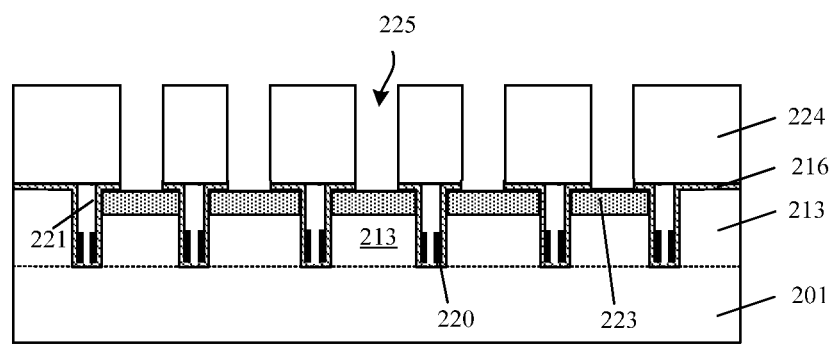
Figure 34:
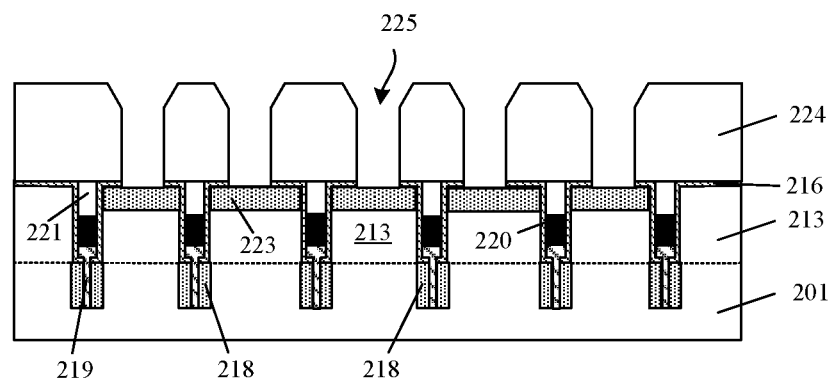
Figure 35:
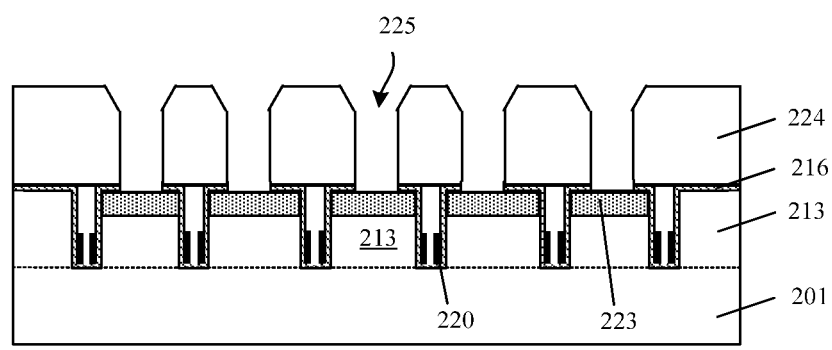
Figure 36:
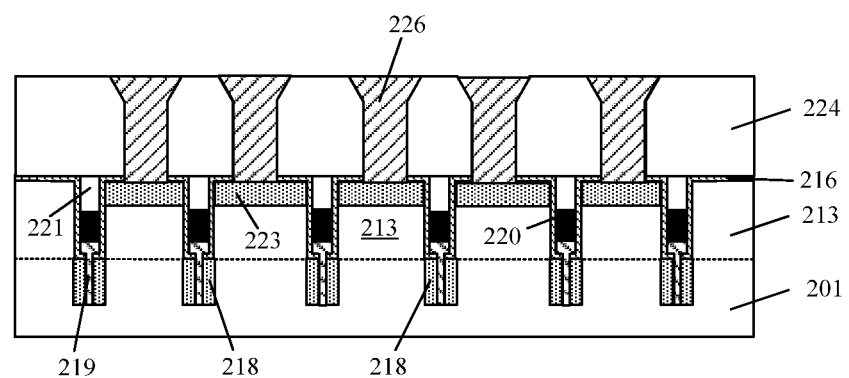
Figure 37:
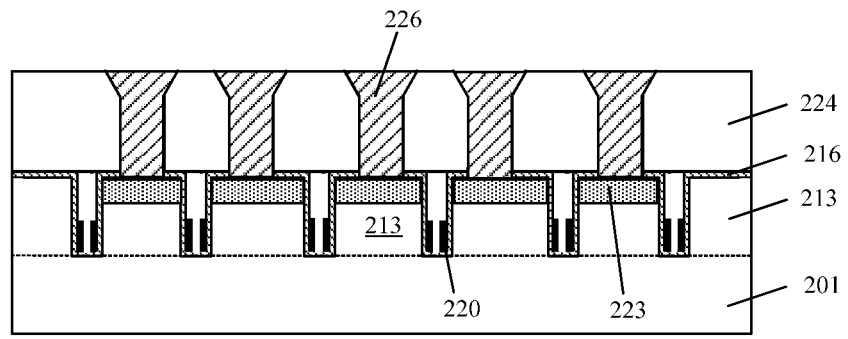
Figure 38:
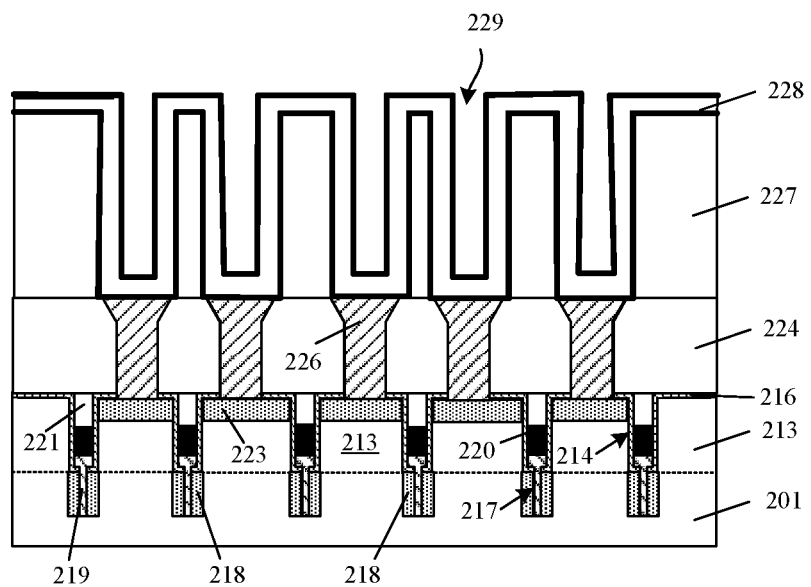
Figure 39:
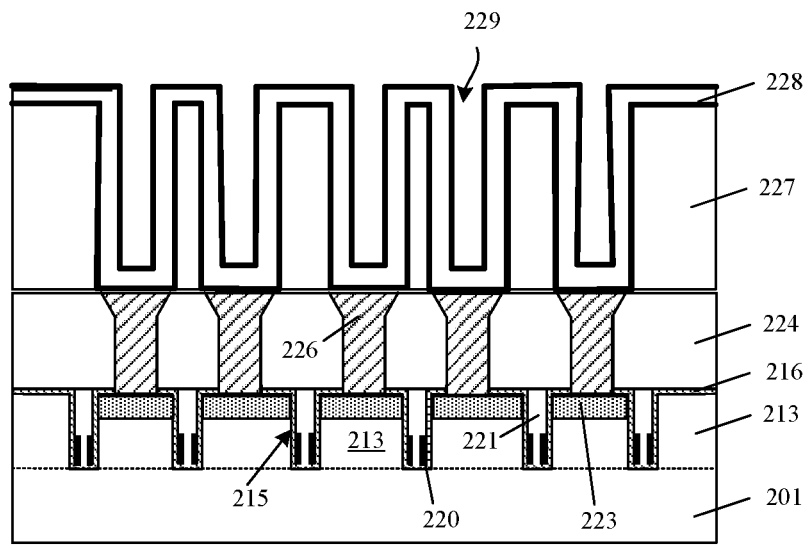

In some embodiments, the process of forming, on a surface of the semiconductor substrate 201, a capacitor connected to the source region 223 includes: referring to FIG. 32 and FIG. 33, forming a third dielectric layer 224 on the active region 213 and the second dielectric layer 221; and forming, in the third dielectric layer 224, a through hole 225 exposing a surface of the source region 223. In some embodiments, after formation of the through hole 225, referring to FIG. 34 and FIG. 34, the following step may further be included: widening an opening of the through hole 225 to facilitate subsequent formation of a contact plug, and to increase a contact area between a top surface of the formed contact plug and the subsequently formed capacitor. Referring to FIG. 36 and FIG. 37, a contact plug 226 is formed in the through hole, and a material of the contact plug 226 is metal. Referring to FIG. 38 and FIG. 39, a fourth dielectric layer 227 is formed on the third dielectric layer 224; a capacitor hole 229 exposing the contact plug is formed in the fourth dielectric layer 227; and a capacitor 228 is formed in the capacitor hole 229.

In some embodiments, the capacitor 228 includes a bottom electrode layer, a dielectric layer located on the bottom electrode layer, and a top electrode layer located on the dielectric layer.

In some embodiments, a material of the dielectric layer may be a high-K dielectric material, so as to increase a capacitance value of the capacitor per unit area. The high-K dielectric material includes one of $HfO_2$, $TiO_2$, $HfZrO$, $HfSiNO$, $Ta_2O_5$, $ZrO_2$, $ZrSiO_2$, $Al_2O_3$, $SrTiO_3$, or $BaSrTiO$, or a stacked layer formed by at least two of groups including the foregoing materials.

A material of each of the top electrode layer and the bottom electrode layer may be one of tungsten, titanium, nickel, aluminum, platinum, titanium nitride, N-type polycrystalline silicon, and P-type polycrystalline silicon, or a stacked layer formed by at least two of groups including the foregoing materials, or may include a compound formed by one or two of metal nitride and metal silicide, such as titanium nitride, titanium silicide, nickel silicide, or silicon titanium nitride (TiSi$_x$N$_y$).

In some other embodiments, the capacitor may alternatively be formed by using an existing double-sided capacitor formation process.

Some embodiments of the present invention further provide a memory device. With reference to FIG. 13 to FIG. 15 and FIG. 38 to FIG. 39, the memory device includes:

a semiconductor substrate 201, where multiple active regions 213 are formed in the semiconductor substrate 201, the multiple active regions 213 are separated by multiple first trenches 214 extending along a first direction and multiple second trenches 215 extending along a second direction, and the first trench 214 communicates with the corresponding second trench 215;

a third trench 217, extending along the first direction and located in a portion of the semiconductor substrate 201 at the bottom of each of the first trenches 214, where a width of the third trench 217 is less than a width of the bottom of the first trench 214;

bit line doped regions 218, located in portions of the semiconductor substrate on two sides of the third trench 217 and at the bottom of the first trench 214;

a gate dielectric layer 216, located on sidewall surfaces of each of the first trench 214 and the second trench 215;

a first dielectric layer 219 that fills the third trench 217;

a metal gate 220, located in each of the first trench 214 on the first dielectric layer 219 and the second trench 215, where a top surface of the metal gate 220 is lower than a top surface of the active region 213, and the metal gate 220 in the second trench 215 is segmented along the second direction;

a second dielectric layer 221 that fills a portion of each of the second trench and the first trench located above the metal gate 220;

a source region 223, located on the top surface of the active region 213; and a capacitor 228, located on a surface of the semiconductor substrate 201 and connected to the source region 223.

In some embodiments, the multiple active regions 213 are arranged in rows and columns.

In some embodiments, the width of the third trench 217 is ¾ to ¼ of the width of the bottom of the first trench 214.

In some embodiments, impurity ions doped in the bit line doped region 218 are N-type impurity ions or P-type impurity ions. A type of impurity ions doped in the source region 223 is the same as a type of the impurity ions doped in the bit line doped region 218 and different from a type of impurity ions in a well region formed in the active region.

In some embodiments, the memory device further includes: a third dielectric layer 224, located on the active region 213 and the second dielectric layer 221, where a contact plug 226 connected to the source region 223 is formed in the third dielectric layer 224; and a fourth dielectric layer 227 located on the third dielectric layer 224, where a capacitor hole exposing the contact plug 226 is formed in the fourth dielectric layer 227, and the capacitor 228 is located in the capacitor hole.

In some embodiments, a material of the metal gate is one or more of W, Al, Cu, Ag, Au, Pt, Ni, Ti, TiN, TaN, Ta, TaC, TaSiN, WN, and Wsi.

It should be noted that the limitations or descriptions of the same or similar structures in this embodiment (memory device) and the foregoing embodiment (the formation process of the memory device) are not repeated in this embodiment. For details, refer to the limitations or descriptions of the corresponding parts in the foregoing embodiment.

Although the present application has been disclosed above with preferred embodiments, these preferred embodiments are not intended to limit the present application. Those skilled in the art can make possible alterations and modifications on the technical solutions of the present application with the methods and technical contents disclosed above without departing from the spirit and scope of the present application. Therefore, any simple changes, equivalent alterations, and modifications made on the foregoing embodiments according to the technical essence of the present application without departing from the contents of the technical solutions of the present application shall fall within the protection scope of the technical solutions of the present application.

The invention claimed is:

1. A method of forming a memory device, comprising:
providing a semiconductor substrate, wherein multiple active regions are formed in the semiconductor substrate, the multiple active regions are separated by multiple first trenches extending along a first direction and multiple second trenches extending along a second direction, and the first trench communicates with the corresponding second trench;
forming, in the semiconductor substrate at a bottom of the first trench, a third trench extending along the first direction, wherein a width of the third trench is less than a width of the bottom of the first trench;
forming a bit line doped region in the semiconductor substrate on two sides of the third trench and at the bottom of the first trench through an ion implantation process;
forming a gate dielectric layer on a sidewall surface and a bottom surface of the first trench and a sidewall surface and a bottom surface of the second trench;
forming a first dielectric layer that fills the third trench;
forming a metal gate in the second trench and the first trench on the first dielectric layer, wherein a top surface of the metal gate is lower than a top surface of the active region;
filling the second trench and the first trench above the metal gate with a second dielectric layer;
etching a portion of the metal gate in the second trench, and segmenting the metal gate in the second trench along the second direction;
forming a source region on the top surface of the active region; and
forming, on a surface of the semiconductor substrate, a capacitor connected to the source region.

2. The method of forming the memory device according to claim 1, wherein the multiple active regions are arranged in rows and columns.

3. The method of forming the memory device according to claim 1, wherein a formation process of the multiple active regions comprises: forming, on the semiconductor substrate, multiple first mask patterns extending along the first direction and parallel to each other, with a first opening formed between adjacent first mask patterns; forming, on the first mask patterns, multiple second mask patterns extending along the second direction and parallel to each other, with a second opening formed between adjacent second mask patterns; etching the first mask pattern along the second opening by using the second mask pattern as a mask and segmenting the first mask pattern along the second direction, and forming multiple discrete block mask patterns;

and etching the semiconductor substrate by using each of the block mask patterns as a mask, and forming, in the semiconductor substrate, the first trench corresponding to the first opening and the second trench corresponding to the second opening, wherein the retained semiconductor substrate between the first trench and the second trench is the multiple active regions.

4. The method of forming the memory device according to claim 3, wherein the first mask pattern and the second mask pattern are formed by using a self-aligned double patterning process.

5. The method of forming the memory device according to claim 4, wherein a formation process of the first mask pattern comprises: forming a first hard mask layer on the semiconductor substrate; forming, on the first hard mask layer, multiple first strip structures extending along the first direction and arranged parallel to each other; forming a first sacrificial sidewall layer on a sidewall and a top surface of the first strip structure and on the first hard mask layer between the first strip structures; filling each portion between the first strip structures with a first filling layer; removing the first sacrificial sidewall layer on the sidewall surface of the first strip structure, and forming a third opening between the first strip structure and the first filling layer; and etching the first hard mask layer along the third opening, and forming the first opening in the first hard mask layer, and using a retained portion of the first hard mask layer as the first mask pattern.

6. The method of forming the memory device according to claim 4, wherein a formation process of the second mask pattern comprises: forming a second hard mask layer on the semiconductor substrate and the first mask pattern; forming, on the second hard mask layer, multiple second strip structures arranged in parallel along the second direction; forming a second sacrificial sidewall layer on a sidewall and a top surface of the second strip structure and on a surface of the second hard mask layer between the second strip structures; filling each portion between the second strip structures with a second filling layer; removing the second sacrificial sidewall layer on the sidewall surface of the second strip structure, and forming a fourth opening between the second strip structure and a second filling layer; and etching the second hard mask layer along the fourth opening, and forming the second opening in the second hard mask layer, and using a retained portion of the second hard mask layer as the second mask pattern.

7. The method of forming the memory device according to claim 1, wherein the width of the third trench is ¼ to ¾ of the width of the bottom of the first trench.

8. The method of forming the memory device according to claim 1, wherein a formation process of the third trench comprises: forming a third mask layer in the first trench, with a sixth opening formed in the third mask layer, extending along the first direction, and exposing a surface of a portion of the semiconductor substrate at the bottom of the first trench; and etching the semiconductor substrate along the sixth opening, and forming the third trench.

9. The method of forming the memory device according to claim 1, wherein the process of forming a bit line doped region in the semiconductor substrate on two sides of the third trench and at the bottom of the first trench through an ion implantation process comprises: forming a fourth mask layer in the third trench and on the top surface of the active region, with a seventh opening formed in the fourth mask layer, extending along the first direction, and exposing the semiconductor substrate on the two sides of the third trench; and performing first ion implantation on the semiconductor substrate at the bottom of the seventh opening along the seventh opening, and forming the bit line doped region in the semiconductor substrate on the two sides of the third trench and at the bottom of the first trench.

10. The method of forming the memory device according to claim 9, wherein impurity ions implanted through the first ion implantation are N-type impurity ions or P-type impurity ions, and the first ion implantation has energy of 20 key to 100 key, a dose of 1E13 to 1E22 atom/cm$^2$, and an angle of 0 to 20 degrees.

11. The method of forming the memory device according to claim 9, wherein the source region is formed through second ion implantation, and a type of impurity ions implanted in the source region is the same as a type of impurity ions implanted in the bit line doped region.

12. The method of forming the memory device according to claim 1, wherein the process of forming, on a surface of the semiconductor substrate, a capacitor connected to the source region comprises: forming a third dielectric layer on the active region and the second dielectric layer; forming, in the third dielectric layer, a through hole exposing a surface of the source region; forming a contact plug in the through hole; forming a fourth dielectric layer on the third dielectric layer; forming, in the fourth dielectric layer, a capacitor hole exposing the contact plug; and forming the capacitor in the capacitor hole.

13. The method of forming the memory device according to claim 1, wherein doping is performed in a well region on the semiconductor substrate, and a type of impurity ions doped in the well region is opposite to a type of impurity ions doped in the source region and a type of impurity ions doped in the bit line doped region.

14. A memory device, comprising:
a semiconductor substrate, wherein multiple active regions are formed in the semiconductor substrate, the multiple active regions are separated by multiple first trenches extending along a first direction and multiple second trenches extending along a second direction, and the first trench communicates with the corresponding second trench;
a third trench, extending along the first direction and located in the semiconductor substrate at a bottom of the first trench, wherein a width of the third trench is less than a width of the bottom of the first trench;
a bit line doped region, located in the semiconductor substrate on two sides of the third trench and at the bottom of the first trench;
a gate dielectric layer, located on a sidewall surface of the first trench and a sidewall surface of the second trench;
a first dielectric layer that fills the third trench;
a metal gate, located in the second trench and the first trench on the first dielectric layer, wherein a top surface of the metal gate is lower than a top surface of the active region, and the metal gate in the second trench is segmented along the second direction;
a second dielectric layer that fills the second trench and the first trench located above the metal gate;
a source region, located on the top surface of the active region; and
a capacitor, located on a surface of the semiconductor substrate and connected to the source region.

15. The memory device according to claim 14, wherein the multiple active regions are arranged in rows and columns.

16. The memory device according to claim 14, wherein the width of the third trench is ¼ to ¾ of the width of the bottom of the first trench.

17. The memory device according to claim 14, wherein impurity ions doped in the bit line doped region are N-type impurity ions or P-type impurity ions.

18. The memory device according to claim 17, wherein a type of impurity ions doped in the source region is the same as a type of the impurity ions doped in the bit line doped region.

19. The memory device according to claim 14, further comprising: a third dielectric layer, located on the active region and the second dielectric layer, wherein a contact plug connected to the source region is formed in the third dielectric layer; and a fourth dielectric layer located on the third dielectric layer, wherein a capacitor hole exposing the contact plug is formed in the fourth dielectric layer, and the capacitor is located in the capacitor hole.

20. The memory device according to claim 14, wherein a material of the metal gate is one or more of W, Al, Cu, Ag, Au, Pt, Ni, Ti, TiN, TaN, Ta, TaC, TaSiN, WN, and Wsi.

* * * * *